(12) United States Patent
Saruwatari et al.

(10) Patent No.: US 6,886,072 B2
(45) Date of Patent: Apr. 26, 2005

(54) CONTROL DEVICE FOR SEMICONDUCTOR MEMORY DEVICE AND METHOD OF CONTROLLING SEMICONDUCTOR MEMORY DEVICE

(75) Inventors: Toshiaki Saruwatari, Kawasaki (JP); Atsushi Fujita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 248 days.

(21) Appl. No.: 10/090,826

(22) Filed: Mar. 6, 2002

(65) Prior Publication Data
US 2003/0005216 A1 Jan. 2, 2003

(30) Foreign Application Priority Data
Jun. 27, 2001 (JP) ........................................ 2001-194810

(51) Int. Cl.$^7$ ............................................. G06F 12/00
(52) U.S. Cl. ...................... 711/106; 711/100; 711/105; 365/185.25; 365/203
(58) Field of Search ........................ 365/185.25, 203; 711/100, 105, 106

(56) References Cited

U.S. PATENT DOCUMENTS 5,784,582 A * 7/1998 Hughes ...................... 710/117

2002/0097613 A1 * 7/2002 Raynham .................... 365/200

OTHER PUBLICATIONS

Patent Abstracts of Japan of JP 11–016339 dated Jan. 22, 1999.

* cited by examiner

*Primary Examiner*—Mano Padmanabhan
*Assistant Examiner*—Mehdi Namazi
(74) *Attorney, Agent, or Firm*—Staas & Halsey LLP

(57) ABSTRACT

As a result of comparing an address set in an area setting register and an address shown by address information of an access request signal, if the address set in the area setting register matches the address shown by the address information, a command with auto precharge is outputted to an FCRAM, and if not, an ordinary command is outputted to the FCRAM. Thus, when an area, in which addresses to be accessed are random in many cases, is accessed, the command with auto precharge is outputted to allow the FCRAM to perform a precharge operation automatically, and when an area, in which addresses to be accessed are sequential in many cases, is accessed, the ordinary command is outputted to allow a read operation or a write operation to be performed continuously, whereby data transfer efficiency can be increased.

21 Claims, 11 Drawing Sheets

F I G. 4
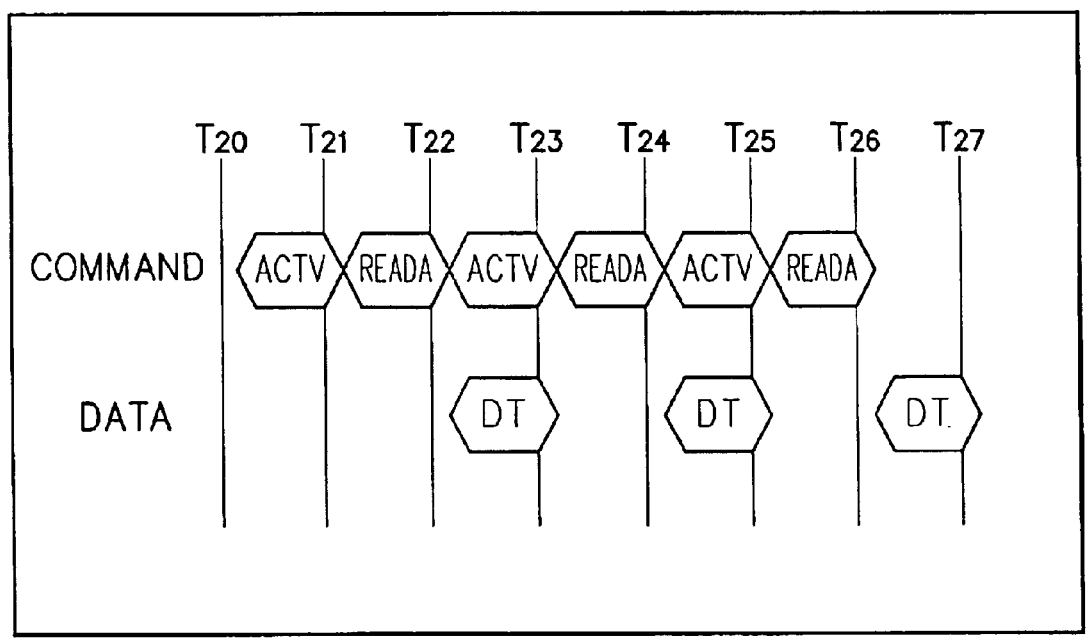

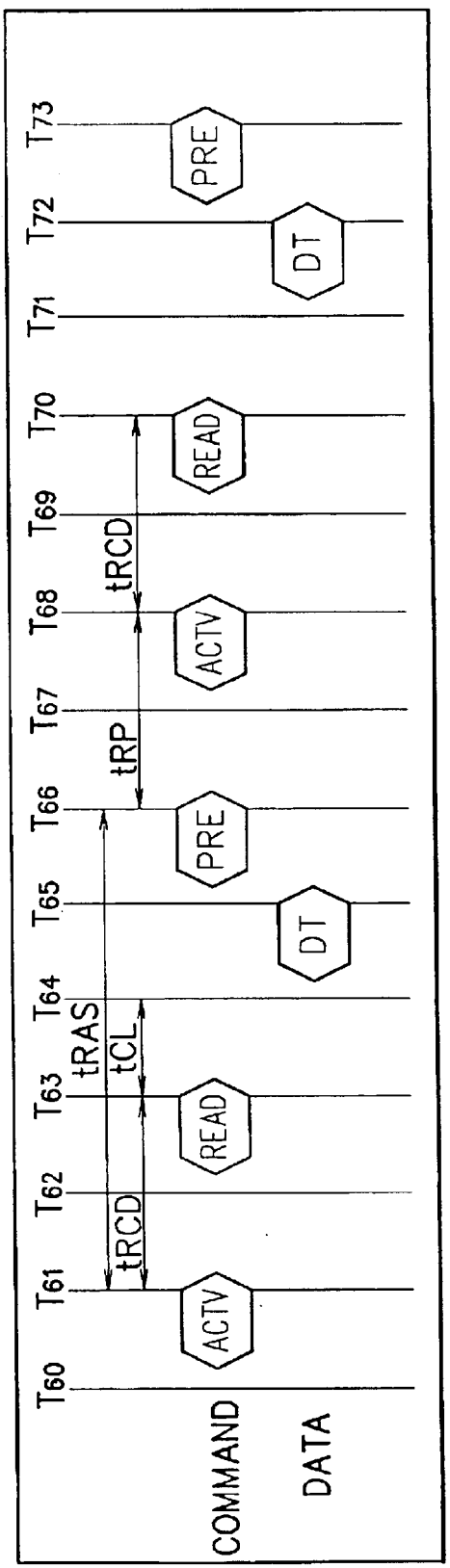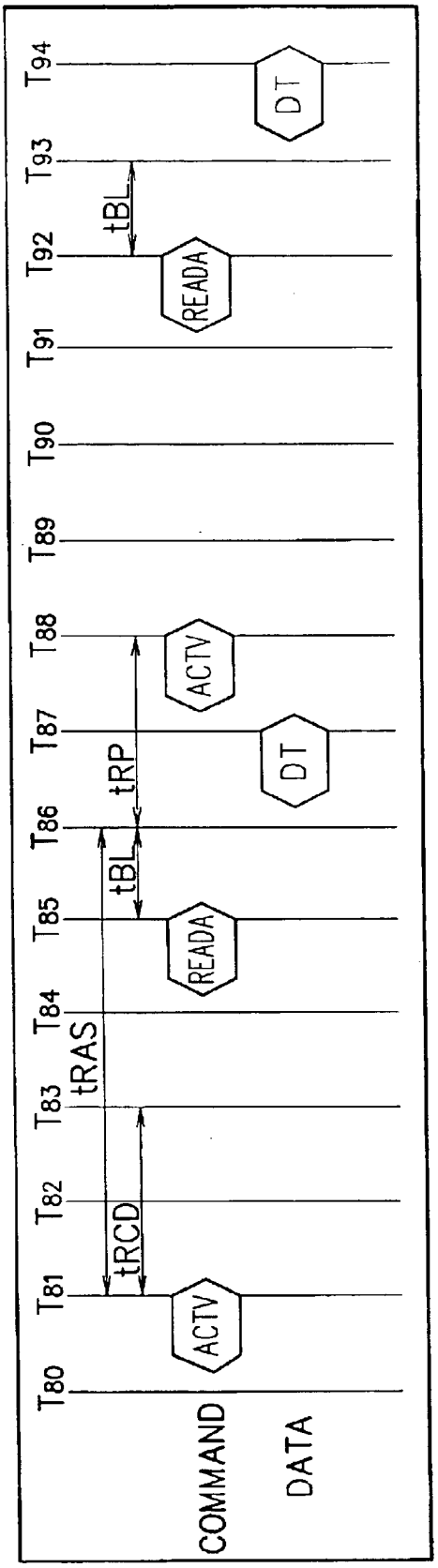

CONTROL DEVICE FOR SEMICONDUCTOR MEMORY DEVICE AND METHOD OF CONTROLLING SEMICONDUCTOR MEMORY DEVICE

CROSS-REFERENCE TO RELATED APPLICATIONS

This application is based upon and claims priority of Japanese Patent Application No. 2001-194810, filed on Jun. 27, 2001, the contents being incorporated herein by reference.

BACKGROUND OF THE INVENTION

1. Field of the Invention

The present invention relates to a control device for a semiconductor memory device and a method of controlling the semiconductor memory device, and the present invention is particularly suitable for a control device for a semiconductor memory device having an auto precharge function.

2. Description of the Related Art

Hitherto, included among DRAMs (Dynamic Random Access Memories) is an SDRAM (synchronous DRAM) in which an external interface operates in synchronization with a clock signal with a given cycle.

FIG. 11A and FIG. 11B are timing diagrams of a read operation in a conventional SDRAM.

In FIG. 11A and FIG. 11B, FIG. 11A is a timing diagram of a read operation when an undermentioned read command with auto precharge is not used, and FIG. 11B is a timing diagram of a read operation when the read command with auto precharge is used.

First, the read operation when the read command with auto precharge is not used in FIG. 11A will be explained.

When an active command ACTV including a row address outputted from a control device not shown is supplied to the SDRAM at a time $T_{61}$, the SDRAM brings a page specified by the row address into an active state. At a time $T_{63}$ after a lapse of a period of time tRCD (after which a read command READ can be outputted) from the output of the active command ACTV, the read command READ including a column address outputted from the control device is supplied to the SDRAM. At a time $T_{65}$ after a lapse of a period of time tCL from the output of the read command READ, the SDRAM outputs (reads) data DT stored in an address specified by the column address in the page brought into the active state by the active command ACTV.

Thereafter, for example, when a read operation is performed for a page different from the page brought into the active state (a row address different from the row address included in the active command ACTV outputted at the time $T_{61}$), the control device supplies a precharge command PRE to the SDRAM at a time $T_{66}$ after a lapse of a period of time tRAS from the output of the active command ACTV. After the precharge command PRE is supplied to the SDRAM, the SDRAM performs a precharge operation in which data in the page brought into the active state is written again to the same address to thereby bring the page into an idle state. Subsequently, at a time $T_{68}$ after a lapse of a period of time tRP from the time $T_{66}$, the control device can output the active command ACTV, and the same operation is performed.

Next, the read operation when the read command with auto precharge is used in FIG. 11B will be explained.

When an active command ACTV including a row address outputted from the control device not shown is supplied to the SDRAM at a time $T_{81}$, the SDRAM brings a page specified from the row address into an active state. At a time $T_{85}$ after a lapse of a predetermined period of time from the output of the active command ACTV, a read command READA with auto precharge including a column address outputted from the control device is supplied to the SDRAM. Incidentally, the predetermined period of time means a lapse of a period of time tRCD (after which the read command can be outputted) from the output of the active command, and a period of time obtained by subtracting a period of time tBL corresponding to a burst length from a period of time tRAS from the output of the ACTV command until when the precharge operation becomes possible.

Thereafter, the SDRAM to which the read command READA is supplied starts a precharge operation, in which data in the page brought into the active state is written again in the same address, at a time $T_{86}$ after the period of time tBL corresponding to the burst length and thereby brings the page into the idle state. Further, the SDRAM, at a time $T_{87}$, outputs (reads) data DT stored in an address specified by the column address in the page brought into the active state. As stated above, when the read command READA with auto precharge is supplied to the SDRAM, the SDRAM outputs the data in the address specified by the column address and performs the precharge operation automatically.

Thereafter, at a time $T_{88}$ after a lapse of a period of time tRP from the time $T_{86}$, the control device can output the active command ACTV.

Similarly, also in a write operation in the conventional SDRAM, there is a write command WRITA with auto precharge for automatically performing the precharge operation as well as the write operation.

In the conventional SDRAM, however, although the read command READA or write command WRITA with auto precharge which enables the read operation or the write operation and the precharge operation to be performed by one read command is provided, an improvement in performance such as data transfer efficiency or the like can not be attained because of various timing constraints such as the period of time tRAS from the output of the active command ACTV until when the precharge operation becomes possible (a period of five clocks in FIG. 11B), and hence the read command READA and write command WRITA with auto precharge have been hardly used.

However, a memory called an FCRAM (Fast cycle RAM) has come into use recently, and the various timing constraints such as the period of time tRAS are greatly eased. In the FCRAM, after one clock from the supply of the active command, the precharge operation can be performed. In other words, commands can be supplied continuously to perform operations, and hence the improvement in performance such as data transfer efficiency can be attained by the read command and write command with auto precharge.

When only the read command or write command with auto precharge is used, in the FCRAM, a page, which is brought into the active state after the data read or write operation in an address specified by the read command or write command with auto precharge, is inevitably brought into the idle state. Therefore, when the read operation or the write operation is performed for the same page, the control device needs to supply the active command again to the FCRAM, and hence when only the read command or write command with auto precharge is used, the performance such as data transfer efficiency is lowered in some cases.

SUMMARY OF THE INVENTION

The present invention is made to solve the problem, and an object of the present invention is to appropriately control a command to be supplied to a semiconductor memory device to enable an increase in data transfer efficiency.

A control device for a semiconductor memory device of the present invention determines whether or not to supply an access instruction for enabling an auto precharge function of automatically performing a precharge operation to the semiconductor memory device based on a request for access to the semiconductor memory device, and supplies the access instruction in accordance with a result of the determination to the semiconductor memory device.

According to the present invention with the configuration, after whether the request for access to the semiconductor memory device is appropriate for the supply of the access instruction for enabling the auto precharge function or not is determined, a command being the appropriate access instruction can be supplied to the semiconductor memory device.

BRIEF DESCRIPTION OF THE DRAWINGS

FIG. 4 is a timing diagram of a read operation (with auto precharge) of the control device for the semiconductor memory device in the first embodiment;

FIGS. 11A and 11B are timing diagrams of a read operation in a conventional SDRAM.

DETAILED DESCRIPTION OF THE PREFERRED EMBODIMENTS

Preferred embodiments of the present invention will be explained below based on the drawings.

First Embodiment

Figure 1:
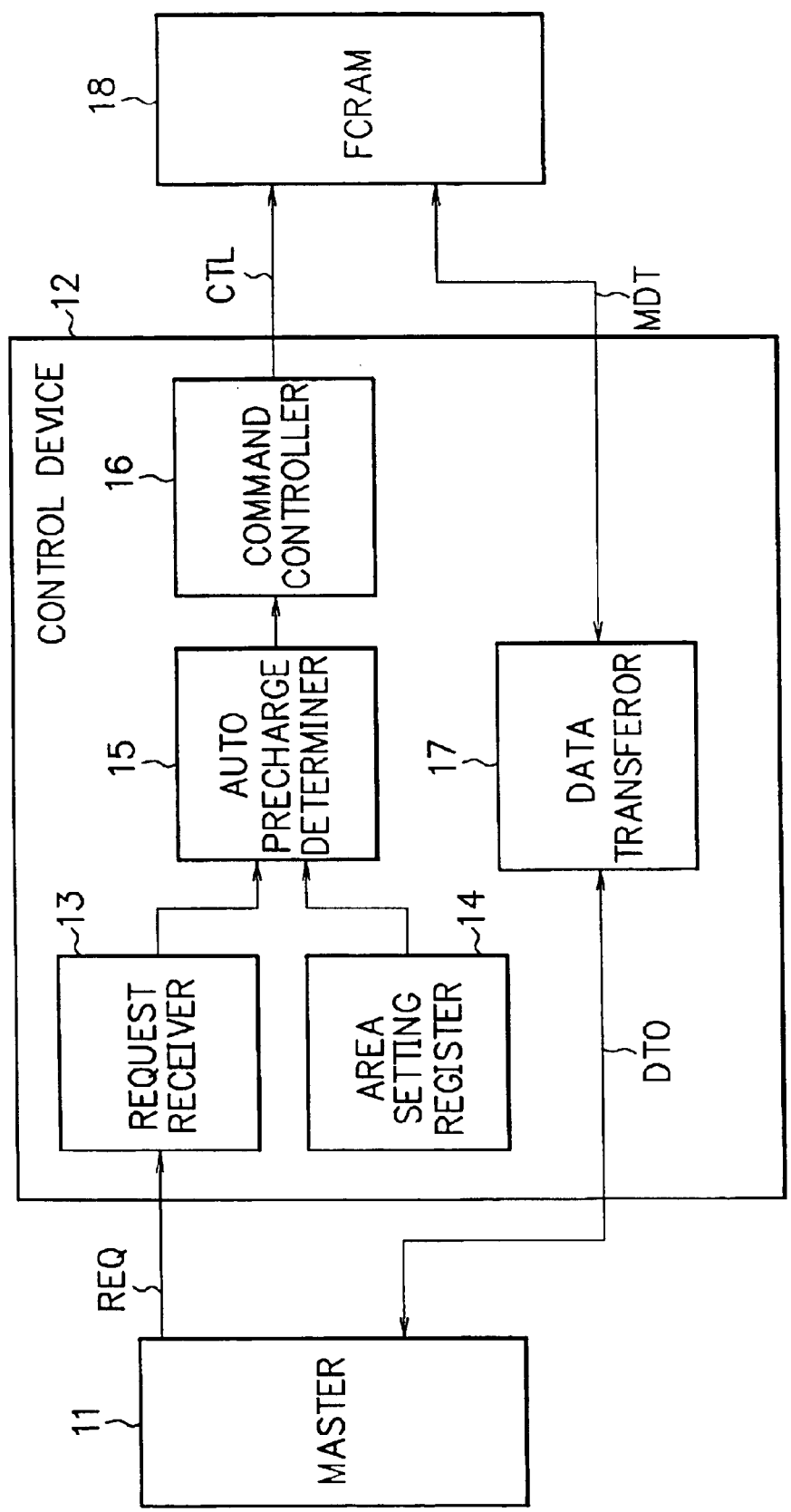
FIG. 1 is a block diagram showing an example of the configuration of a memory control device to which a control device for a semiconductor memory device according to a first embodiment is applied.

FIG. 1 is a block diagram showing an example of the configuration of a memory control device to which a control device for a semiconductor memory device according to the first embodiment of the present invention is applied.

In FIG. 1, a master 11 supplies an access request signal REQ to make a request for access (data transfer) to an FCRAM (memory) 18 to a control device 12, and sends and receives input/output data DTO to/from the control device 12. The master 11 is, for example, composed of a CPU and a DMAC (Direct Memory Access Controller). The access request signal REQ includes access class information showing the class of access (read access or write access), and address information showing an address of the FCRAM 18 to be accessed. Incidentally, it may further include information on the size of data to be transferred and the like.

The control device 12 is composed of a request receiver 13, an area setting register 14, an auto precharge determiner 15, a command controller 16, and a data transferor 17, and supplies a memory control signal CTL in response to the access request signal REQ supplied from the master 11 to the FCRAM 18.

The request receiver 13 receives the request for access to the FCRAM 18 from the master 11 by means of the access request signal REQ and outputs access class information, address information, and the like. The area setting register 14 is a register in which an area (address) in which a command with auto precharge (a read command READA or a write command WRITA) is used when the FCRAM 18 is accessed is set. For example, in the FCRAM 18, when there exist a program area where, in many cases, like a program, data are written into sequential addresses and read from sequential addresses on the occasion of read-out, and a data area where, in many cases, data are written into arbitrary addresses and read after random (random) addresses are specified on the occasion of read-out, in the area setting register 14, a data area or the like in the FCRAM 18 is set as an area where the command with auto precharge is used.

The auto precharge determiner 15 compares an address shown by the address information supplied from the request receiver 13 and an address set in the area setting register 14, and determines whether or not the address shown by the address information is the area where the command with auto precharge is used. Based on the determination by the auto precharge determiner 15, and the access class information and the address information of the access request signal REQ, the command controller 16 determines a command to be outputted to the FCRAM 18 and supplies the memory control signal CTL including the command to the FCRAM 18.

The data transferor 17 supplies the input/output data DTO supplied from the master 11 as memory data MDT to the FCRAM 18, and supplies the memory data MDT supplied from the FCRAM 18 as the input/output data DTO to the master 11.

The FCRAM 18 has an interface similar to an SDRAM, and writes the memory data MDT into the specified address in accordance with the memory control signal CTL supplied from the control device 12 (a write operation), and reads data from the specified address and supplies it as the memory data MDT to the control device 12 (a read operation).

Next, operations will be explained.

It should be mentioned that, in the following explanation, in the area setting register 14, an area (address) in which the command with auto precharge is used at the time of access to the FCRAM 18 is previously set.

First, the master 11 outputs the access request signal REQ to the control device 12 to request access to the FCRAM 18. The request receiver 13 within the control device 12, to which the access request signal REQ is supplied, receives an access request from the master 11, and supplies the access class information and the address information to the auto precharge determiner 15 based on the access request signal REQ.

The auto precharge determiner 15 compares an address shown by the address information supplied from the request receiver 13 and an address set in the area setting register 14. When the address shown by the address information is included in the address set in the area setting register 14, the auto precharge determiner 15 instructs the command controller 16 to output a command with auto precharge. Meanwhile, when the address shown by the address information is not included in the address set in the area setting register 14, the auto precharge determiner 15 instructs the command controller 16 to output an ordinary command (without auto precharge).

Figure 2:
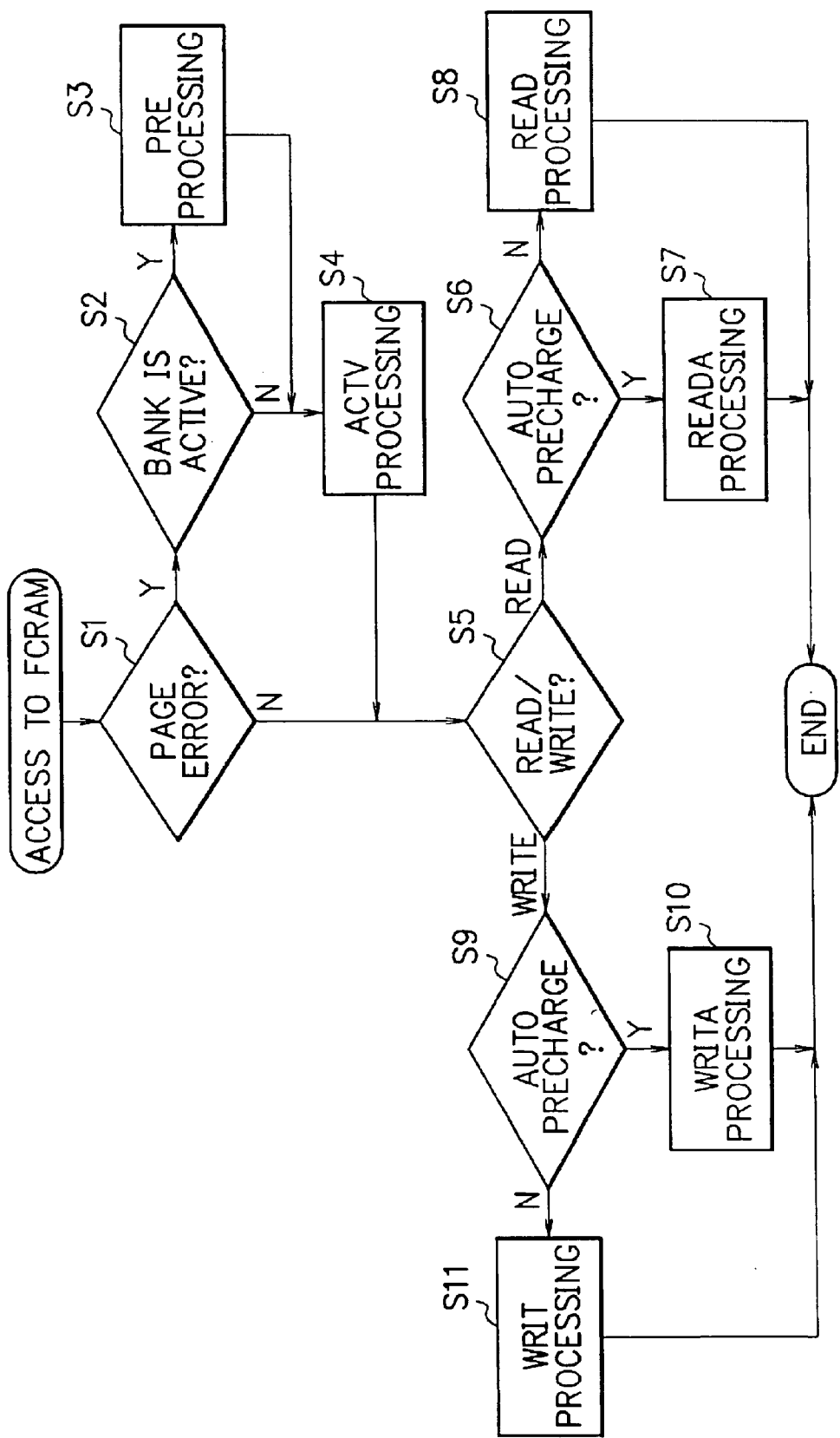
FIG. 2 is a flowchart showing an operation of a command controller.

Based on the instruction (determination result) from the auto precharge determiner 15, and the address class information and the address information of the access request signal REQ, the command controller 16 determines a command to be outputted to the FCRAM 18 in accordance with a flowchart shown in FIG. 2, and supplies the memory control signal CTL including the above command to the FCRAM 18.

FIG. 2 is a flowchart showing a processing operation of the command controller 16.

First, in accessing the FCRAM 18, the command controller 16 determines whether or not the access to the FCRAM 18 results in a page error based on the supplied address information in step S1. Specifically, the command controller 16 compares a row address shown by the address information (for example, upper 12 bits of the address shown by the address information) and a row address of a page currently in an active state.

When the row address shown by the address information and the row address of the page in the active state do not match, the command controller 16 determines that the access results in a page error, and advances to step S2. In the case of a match between them, it determines that the access does not result in a page error (results in a page hit), and advances to step S5. Incidentally, when there is no page in the active state (all pages are in an idle state), it determines that the access results in a page error.

In step S2 to which the command controller 16 advances when the row address shown by the address information and the row address of the page in the active state do not match, the command controller 16, based on a bank signal not shown, determines whether this page error is a page error in a bank in the active state (the row addresses do not match) or a page error caused because a bank is not in the active state. Here, the bank is composed of a plurality of pages.

As a result of the determination, when determining that this page error is the page error in the active state, the command controller 16 advances to step S3, and when determining that this page error is caused because the bank is not in the active state, it advances to step S4. In step S3, the command controller 16 outputs a precharge command PRE to the FCRAM 18 to bring the bank in the active state into the idle state and advances to step S4.

In step S4 in which all pages (bank) in the FCRAM 18 are in the idle state, the command controller 16 outputs an active command ACTV for bringing the page (row address) specified by the address information into the active state to the FCRAM 18 and advances to step S5.

Next, in step S5, the command controller 16 determines whether to get read access or write access to the FCRAM 18 based on the supplied access class information.

In the case of read access as a result of the aforesaid determination, the command controller 16 advances to step S6. When being instructed to output a command with auto precharge by an instruction (determination result) from the auto precharge determiner 15 in step S6, the command controller 16 outputs a read command READA with auto precharge to the FCRAM 18 in step S7 and ends processing. On the other hand, if not, in step S8, the command controller 16 outputs an ordinary command READ to the FCRAM 18 and ends processing.

In the case of write access as a result of the determination in step S5, the command controller 16 advances to step S9. As is the case of the read access, when being instructed to output a command with auto precharge by an instruction (determination result) from the auto precharge determiner 15 in step S9, the command controller 16 outputs a write command WRITA with auto precharge to the FCRAM 18 in step S10, and if not, the command controller 16 outputs an ordinary write command WRIT to the FCRAM 18 and ends processing.

In the processing shown in FIG. 2, commands outputted successively to the FCRAM 18 are supplied to the FCRAM 18 by the memory control signal CTL including these commands.

The FCRAM 18 performs a read operation, a write operation, and the like in accordance with the memory control signal CTL including the commands supplied from the command controller 16 to read stored data and output the data as the memory data MDT, and store the supplied memory data MDT.

Incidentally, as for the input/output data DTO sent and received between the control device 12 (data transferor 17) and the master 11, and the memory data MDT sent and received between the control device 12 (data transferor 17) and the FCRAM 18, their data input/output timings are respectively controlled by the data transferor 17 according to access to the FCRAM 18, and then they are sent and received.

Figure 3:
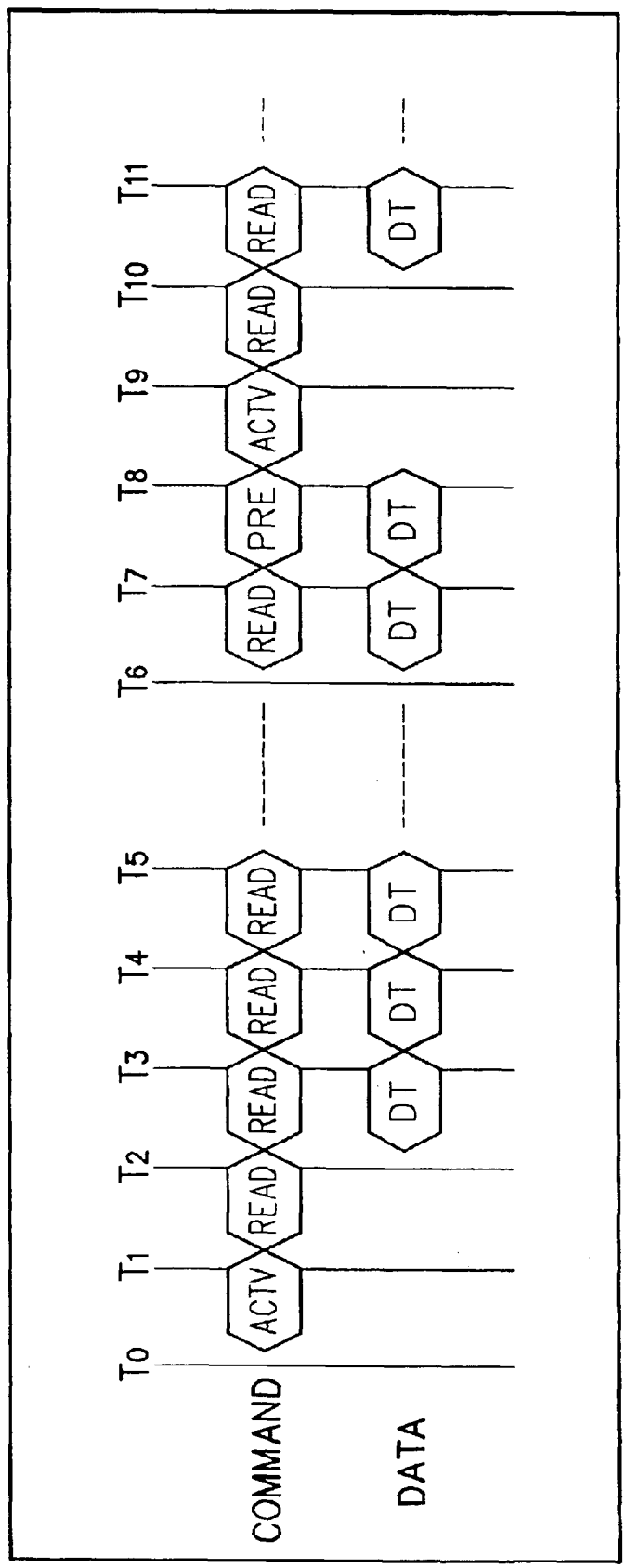
FIG. 3 is a timing diagram of a read operation (without auto precharge) of the control device for the semiconductor memory device in the first embodiment.

FIG. 3 and FIG. 4 show timing diagrams of the read operation for the FCRAM 18 in accordance with the operations.

FIG. 3 is a timing diagram when the auto precharge determiner 15 determines that the ordinary command (without auto precharge) is outputted.

As shown in FIG. 3, when the auto precharge determiner 15 determines that the ordinary command (without auto precharge) is outputted, the command controller 16 outputs an active command ACTV to the FCRAM 18 at a time $T_1$ and thereafter outputs the ordinary read command READ to the FCRAM 18 until a page error occurs. Namely, during a page hit period (a period during which the same page is accessed), the command controller 16 outputs only the ordinary read command READ to the FCRAM 18. In accordance with the ordinary read command READ, the data DT is outputted from the FCRAM 18 to the control device 12.

In accessing a different page, the command controller 16, as shown at a time $T_8$, outputs the precharge command PRE to the FCRAM 18 to bring all pages into the idle state. At a time $T_9$ after one clock, the active command ACTV to bring the different page into the active state is outputted to the FCRAM 18, and at a time $T_{10}$, for example, the read command READ is outputted.

FIG. 4 is a timing diagram when the auto precharge determiner 15 determines that the command with auto precharge is outputted.

As shown in FIG. 4, when the auto precharge determiner 15 determines that the command with auto precharge is outputted, the command controller 16 outputs the active command ACTV to the FCRAM 18 at a time $T_{21}$, and outputs the read command READA with auto precharge to the FCRAM 18 at a time $T_{22}$ after one clock. Thus, the FCRAM 18 outputs the data DT in an address, which is specified by the read command READA, of a page brought into the active state by the active command ACTV at the time $T_{21}$ (at a time $T_{23}$), and performs a precharge operation to bring the page into the idle state. Thereafter, when the FCRAM 18 is accessed again, the command controller 16 outputs the active command ACTV to the FCRAM 18 as shown at the time $T_{23}$, and outputs the read command READA at a time $T_{24}$.

As explained above in detail, according to the first embodiment, in accessing the FCRAM 18, an address set in the area setting register 14 in which an area where the command with auto precharge (read command READA or write command WRITA) is used is set and an address shown by the address information of the access request signal REQ received by the request receiver 13 are compared. When the address set in the area setting register 14 and the address shown by the address information match as a result of the above comparison, the command with auto precharge is outputted to the FCRAM 18, and if not, the ordinary command (read command READ or write command WRIT) is outputted to the FCRAM 18. Moreover, in the area setting register 14, for example, the address of the data area where addresses to be accessed are often random or the like is set.

Thus, in accessing the area where addresses to be accessed are often random (random), the command with auto precharge is outputted to allow the FCRAM 18 to perform the precharge operation automatically without the precharge command PRE being outputted. Moreover, in accessing the area where addresses to be accessed are often sequential, the ordinary command is outputted to allow the read operation or the write operation to be performed continuously without the active command ACTV being outputted at each access. Accordingly, by controlling the command to be outputted to the FCRAM 18 depending on the area in the FCRAM 18 to be accessed, the number of outputs of the command to the FCRAM 18 can be reduced, leading to an increase in data transfer efficiency.

Incidentally, although the area (address) where the command with auto precharge is used is set in the area setting register 14 in the first embodiment, an area (address) where the ordinary command is used may be set, or both the area (address) where the command with auto precharge is used and the area (address) where the ordinary command is used may be set. Hence, based on the address set in the area setting register 14, the auto precharge determiner 15 may determine whether the command with auto precharge is used or not.

Second Embodiment

Next, the second embodiment will be explained.

Figure 5:
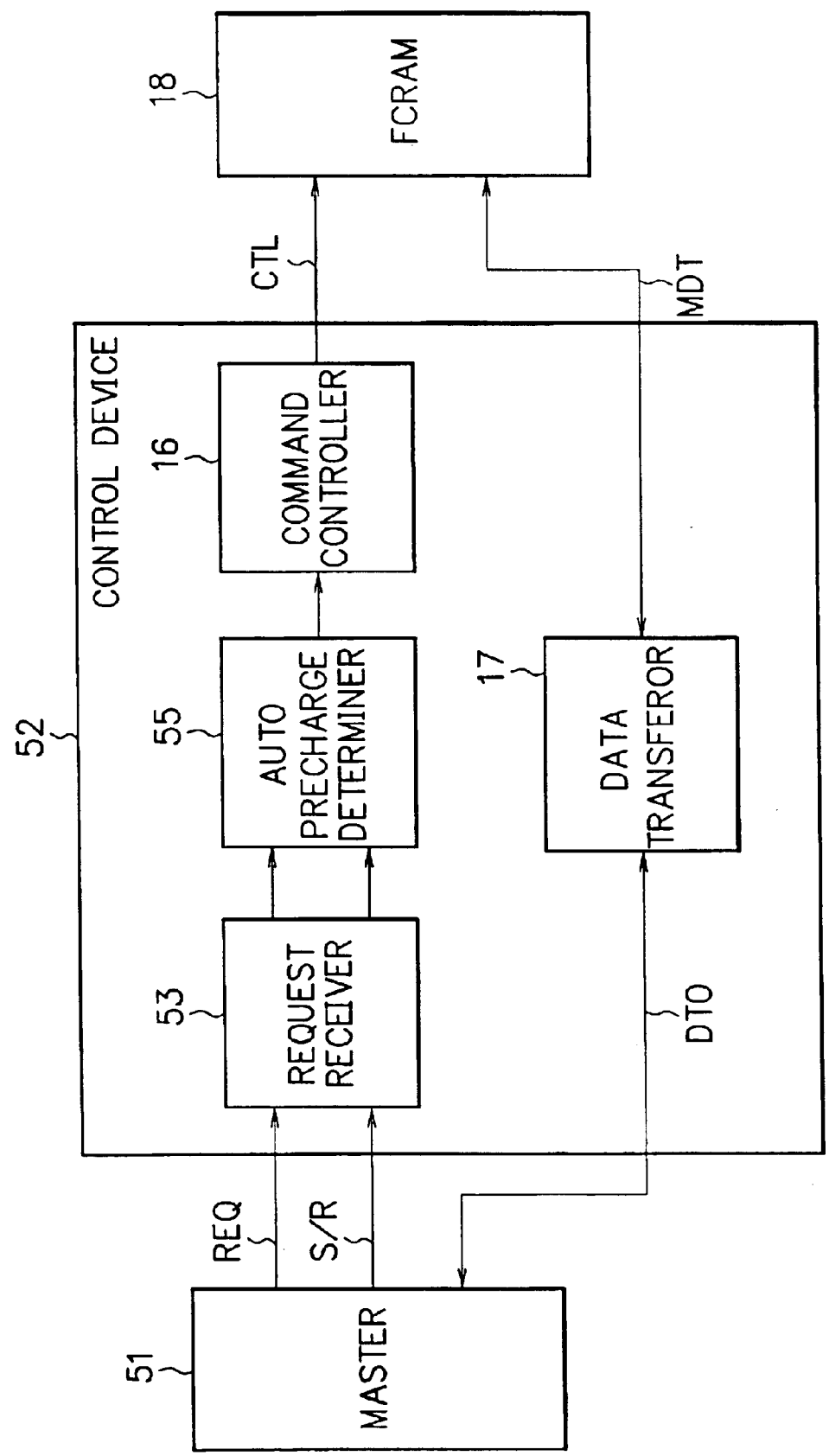
FIG. 5 is a block diagram showing an example of the configuration of a memory control device to which a control device for a semiconductor memory device according to a second embodiment is applied.

FIG. 5 is a block diagram showing an example of the configuration of a memory control device to which a control device for a semiconductor memory device according to the second embodiment of the present invention is applied. It should be mentioned that, in FIG. 5, the same numerals and symbols are given to blocks having the same functions as blocks shown in FIG. 1, and a repeated explanation is omitted.

In FIG. 5, similarly to the master 11 shown in FIG. 1, a master 51 supplies the access request signal REQ to a control device 52, and sends and receives the input/output data DTO to/from the control device 52. Further, the master 51 supplies an access type signal S/R indicating access type information that access to the FCRAM 18 is sequential access to sequential addresses or random access to random addresses, to the FCRAM 18.

The control device 52 is composed of a request receiver 53, an auto precharge determiner 55, the command controller 16, and the data transferor 17.

The request receiver 53 receives an access request by means of the access request signal REQ supplied from the master 51, and outputs the access class information, the address information, and the like. Moreover, the request receiver 53 outputs the access type information (sequential access or random access) to the auto precharge determiner 55 based on the access type signal S/R supplied with the access request signal REQ.

Based on the access type information supplied from the request receiver 53, the auto precharge determiner 55 determines whether the command with auto precharge is used or not.

Next, operations will be explained.

When being supplied with the access type signal S/R together with the access request signal REQ by the master 51 and receiving the access request, the request receiver 53 supplies the access class information, the address information, and the access type information to the auto precharge determiner 55 based on these access request signal REQ and access type signal S/R.

Based on the access type information supplied from the request receiver 13, the auto precharge determiner 55 determines whether the access requested from the master 51 is sequential access or random access. As a result of the determination, if the access requested from the master 51 is sequential access, the auto precharge determiner 51 instructs the command controller 16 to output the ordinary command (without auto precharge), and if the access is random access, it instructs the command controller 16 to output the command with auto precharge.

Operations after this by the command controller 16 and the like are the same as those in the first embodiment, and hence they are omitted.

It should be mentioned that timing diagrams of the read operation for the FCRAM 18 in the second embodiment are the same as those shown in FIG. 3 and FIG. 4 in the first embodiment.

As explained above, according to the second embodiment, in accessing the FCRAM 18, based on the access type signal S/R supplied with the access request signal REQ, the command with auto precharge is outputted to the FCRAM 18 in the case of random access, and the ordinary command is outputted to the FCRAM 18 in the case of sequential access.

Thereby, in the case of access to random addresses by means of random access, by outputting the command with auto precharge, the FCRAM 18 is allowed to perform the precharge operation automatically without the precharge command PRE being outputted. In the case of access to sequential addresses by means of sequential access, by outputting the ordinary command, the read operation or the write operation can be performed continuously without the active command ACTV being outputted at each access. Accordingly, by controlling the command to be outputted to the FCRAM 18 according to the way of access to the FCRAM 18, the number of outputs of the command to the FCRAM 18 can be reduced, leading to an increase in data transfer efficiency.

Third Embodiment

Next, the third embodiment will be explained.

Figure 6:
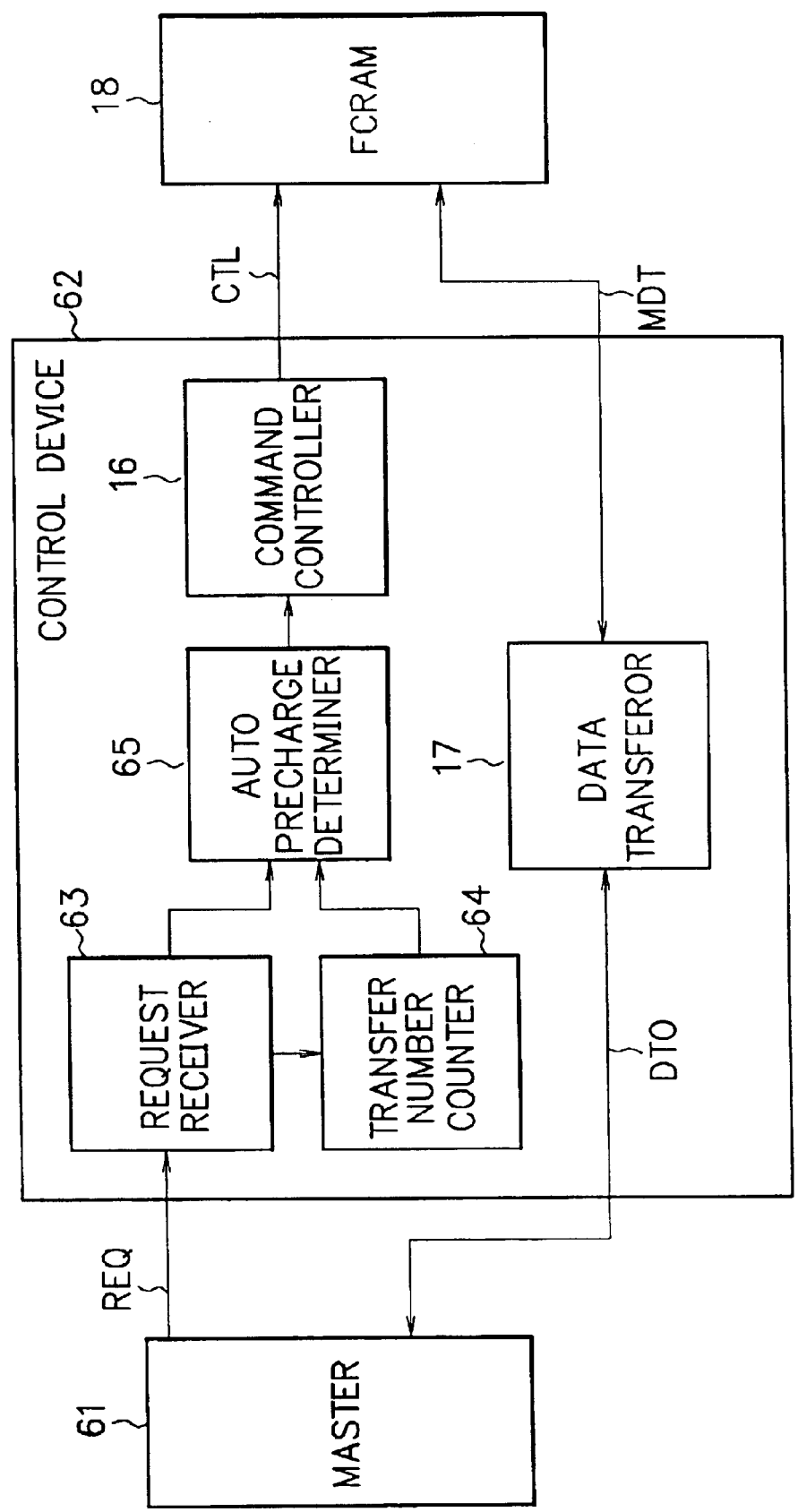
FIG. 6 is a block diagram showing an example of the configuration of a memory control device to which a control device for a semiconductor memory device according to a third embodiment is applied.

FIG. 6 is a block diagram showing an example of the configuration of a memory control device to which a control device for a semiconductor memory device according to the third embodiment of the present invention is applied. It should be mentioned that in FIG. 6, the same numerals and symbols are given to blocks having the same functions as blocks shown in FIG. 1, and a repeated explanation is omitted.

In FIG. 6, similarly to the master 11 shown in FIG. 1, a master 61 supplies the access request signal REQ to a control device 62, and sends and receives the input/output data DTO to/from the control device 62. It should be mentioned that the access request signal REQ in this embodiment includes data size information showing the size of data to be transferred in addition to the access class information and the address information.

The control device 62 is composed of a request receiver 63, a transfer number counter 64, an auto precharge determiner 65, the command controller 16, and the data transferor 17.

The request receiver 63 receives an access request by means of the access request signal REQ supplied from the master 61, and based on this access request signal REQ, outputs the access class information, the address information, and the like to the auto precharge determiner 65 and the data size information to the transfer number counter 64.

The transfer number counter 64 computes the number of outputs of the read command or the write command to be outputted to the FCRAM 18, based on a burst length (the number of times of data input/output operations performed per one command) set in the FCRAM 18 and the width of a data bus to send and receive the memory data MDT. For example, when the data size shown by the data size information is 32 bits, the burst length set in the FCRAM is two, and the width of the data bus to send and receive the memory data MDT is eight bits, the number of outputs of the command is 32/(2×8)=2. Further, with the above computed number of outputs as an initial value, the transfer number counter 64 decrements a counter value by one and supplies the counter value to the auto precharge determiner 65 each time the read command or the write command is outputted from the command controller 16 to the FCRAM 18.

Based on the counter value supplied from the transfer number counter 64, the auto precharge determiner 65 determines that the command with auto precharge is outputted only at the time of the last command output, and instructs the command controller 16 to output the command with auto precharge. At all other times than the last command output, it determines that the ordinary command is outputted.

Next, operations will be explained.

When receiving the access request by means of the access request signal REQ from the master 61, the request receiver 63, based on this access request signal REQ, outputs the access class information, the address information, and the like to the auto precharge determiner 65, and outputs the data size information to the transfer number counter 64.

The transfer number counter 64 to which the data size information is supplied computes the number of outputs of the command (read command or write command) to the FCRAM 18 based on the burst length of the FCRAM 18 and the width of the data bus to send and receive the memory data MDT. Moreover, it sets the computed number of outputs as the initial value and supplies the counter value to the auto precharge determiner 65.

If the counter value supplied from the transfer number counter 64 is one, the auto precharge determiner 65 instructs the command controller 16 to output the command with auto precharge, and if not, it instructs the command controller 16 to output the ordinary command (without auto precharge).

In response to the above instruction from the auto precharge determiner 65, the command controller 16 determines the command to be outputted to the FCRAM 18 in the same manner as in the first embodiment, and outputs the memory control signal CTL including that command. On this occasion, the transfer number counter 64 decrements the counter value by one and supplies the counter value to the auto precharge determiner 65 each time the read command READ or the write command WRIT is outputted from the command controller 16 to the FCRAM 18.

Thereby, when plural times of access to sequential addresses in the FCRAM 18 are needed because the data size shown by the data size information is larger than (the burst length set in the FCRAM 18)×(the width of the data bus to send and receive the memory data MDT), the auto precharge determiner 65 determines that the command with auto precharge is outputted only at the time of the last command output, and instructs the command controller 16 to output the command with auto precharge. At all other times than the last command output, it determines that the ordinary command is outputted and instructs the command controller 16 to output the ordinary command. Namely, commands are outputted from the control device 62 to the FCRAM 18 as shown in FIG. 7.

Figure 7:
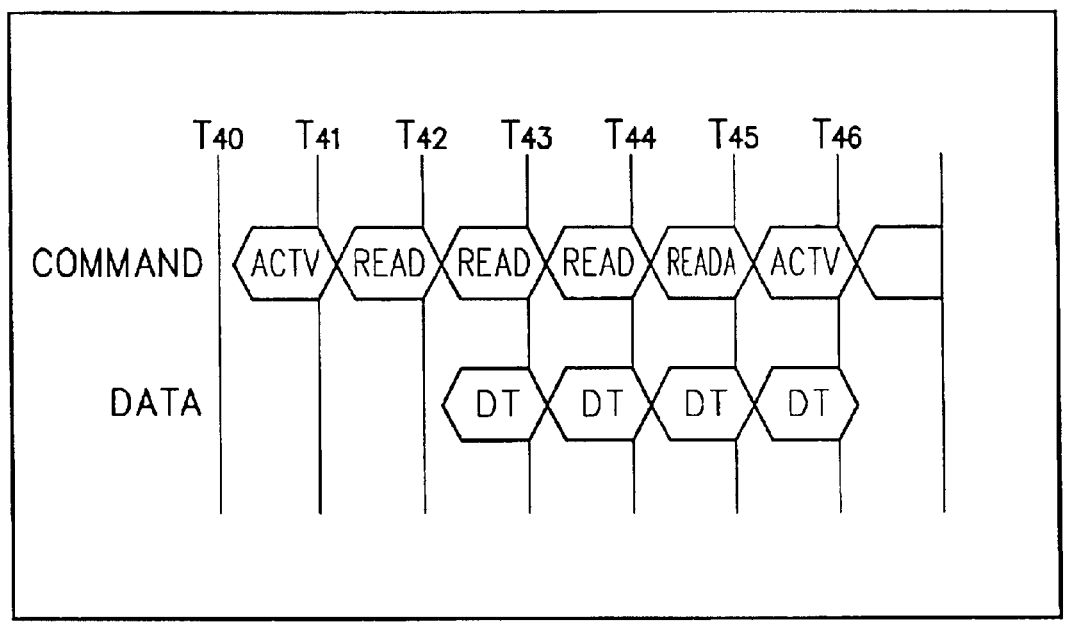
FIG. 7 is a timing diagram of a read operation of the control device for the semiconductor memory device in the third embodiment.

FIG. 7 shows an example of a timing diagram of a read operation according to the third embodiment shown in FIG. 6.

It should be mentioned that FIG. 7 shows a case where the number of outputs of the read command computed by the transfer number counter 64 based on the data size information is four.

At a time $T_{41}$, the command controller 16 outputs the active command ACTV to the FCRAM 18. The command controller 16 then outputs the ordinary read command READ to the FCRAM 18 at times $T_{42}$, $T_{43}$, and $T_{44}$ which are one time fewer than the total number of outputs of the read command in this access. At a time $T_{45}$ which is the last read command output in this access, the read command READA with auto precharge is outputted to the FCRAM 18. Thereafter, when the FCRAM 18 is accessed again, for example, as shown at a time $T_{46}$, the command controller 16 outputs the active command ACTV to the FCRAM 18 to start the access.

According to the third embodiment as explained above, based on the number of outputs of command computed by the transfer number counter 64 from the data size information of the access request signal REQ received by the request receiver 63, the command with auto precharge only as the command outputted lastly is outputted to the FCRAM 18, and at all other times, the ordinary command is outputted to the FCRAM 18.

Hence, in accessing the FCRAM 18 more than one time at sequential addresses in order to transfer a data quantity requested by the access request, the ordinary command is outputted to continuously perform the read operation or the write operation during a period of sequential access. When the period of sequential access ends, the command with auto precharge is outputted to allow the FCRAM 18 to perform the precharge operation automatically without the precharge command PRE being outputted. Consequently, in the case of sequential access, the number of outputs of the command to the FCRAM 18 can be minimized, leading to an increase in data transfer efficiency.

Fourth Embodiment

Next, the fourth embodiment will be explained.

Figure 8:
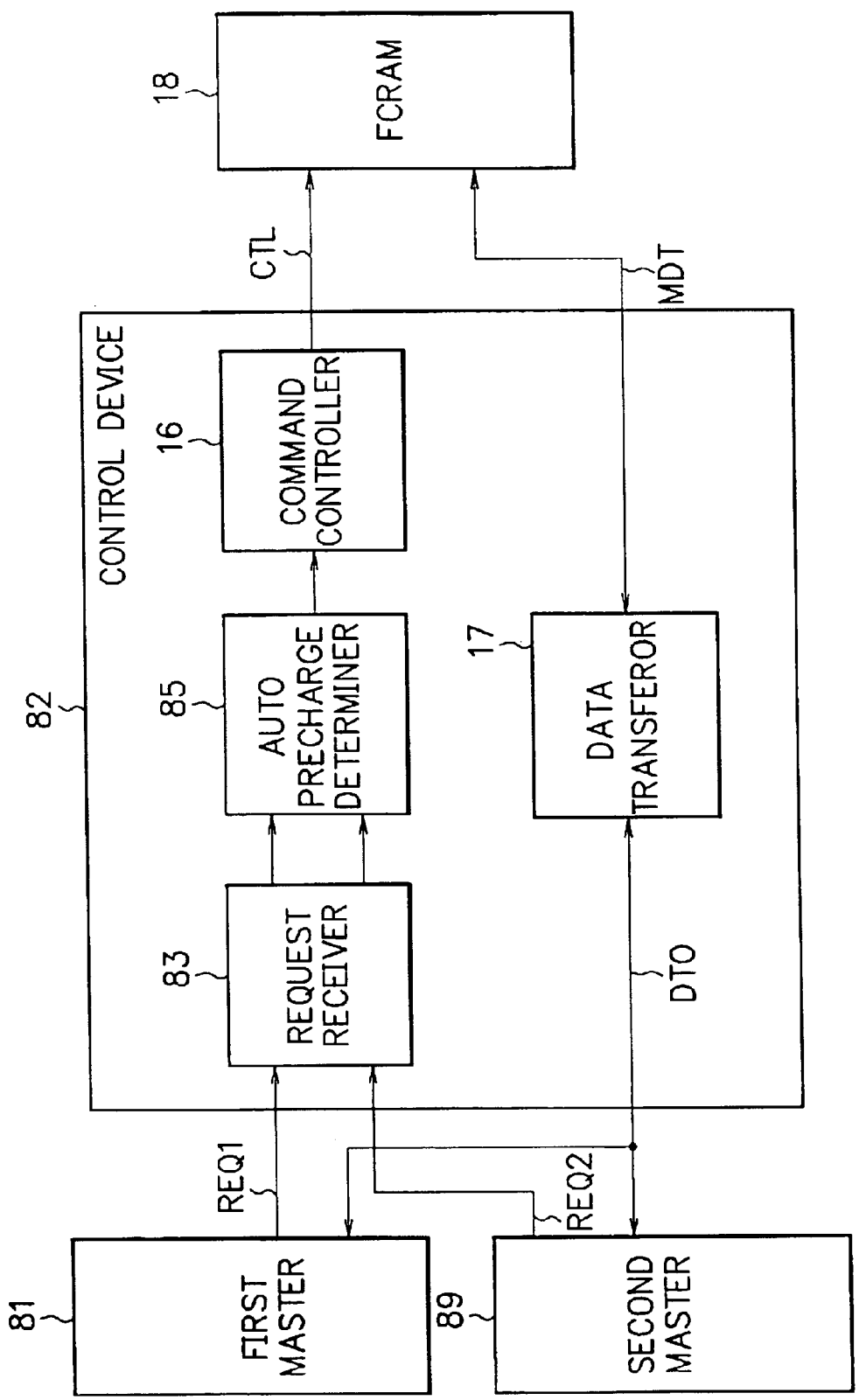
FIG. 8 is a block diagram showing an example of the configuration of a memory control device to which a control device for a semiconductor memory device according to a fourth embodiment is applied.

FIG. 8 is a block diagram showing an example of the configuration of a memory control device to which a control device for a semiconductor memory device according to the fourth embodiment of the present invention is applied. It should be mentioned that in FIG. 8, the same numerals and symbols are given to blocks having the same functions as blocks shown in FIG. 1, and a repeated explanation is omitted.

In FIG. 8, similarly to the master 11 shown in FIG. 1, a first and second masters 81 and 89 respectively supply access request signals REQ1 and REQ2 to a control device 82, and send and receive the input/output data DTO to/from the control device 82.

The control device 82 is composed of a request receiver 83, an auto precharge determiner 85, the command controller 16, and the data transferor 17.

The request receiver 83 receives access requests by means of the access request signals REQ1 and REQ2 supplied from the first and second masters 81 and 89 respectively, and outputs the access class information, the address information, and the like to the auto precharge determiner 85 based on the access request signals REQ1 and REQ2. Moreover, the request receiver 83 is designed in such a manner that the access request signals REQ1 and REQ2 are inputted via different input terminals, generates master information showing which of the first and second masters 81 and 89 an access request is received from, and outputs the master information to the auto precharge determiner 85.

Based on the master information supplied from the request receiver 83, the auto precharge determiner 85 determines whether the command with auto precharge is used or not. Incidentally, in the auto precharge determiner 85, according as whether the first and second masters 81 and 89 are masters which, like a CPU or a peripheral circuit, make a request for access to random addresses separately or masters which, like a DMAC, make a request for access to a certain area (plural sequential addresses), whether the command with auto precharge is used or not is previously determined for each of the first and the second masters 81 and 89.

It should be mentioned that, in the following explanation, in the auto precharge determiner 85, it is determined that the ordinary command is used for access to the FCRAM from the first master 81, and that the command with auto precharge is used for access thereto from the second master 89.

Next, operations will be explained.

When receiving access requests from the first and second masters 81 and 89 by means of the access request signals REQ1 and REQ2, the request receiver 83 supplies the access class information and the address information to the auto precharge determiner 85 based on the supplied access request signals REQ1 and REQ2. Moreover, the request receiver 83 determines which of the first and second masters 81 and 89 each of the access requests is received from by the supplied access request signal REQ1 or REQ2, and supplies the determination result as the master information to the auto precharge determiner 85.

Based on the master information supplied from the request receiver 83, the auto precharge determiner 85 instructs the command controller 16 to output the ordinary command in the case of the access request from the first master 81, and instructs the command controller 16 to output the command with auto precharge in the case of the access request from the second master 89.

Operations after this by the command controller 16 and the like are the same as those in the first embodiment, and hence they are omitted.

It should be mentioned that a timing diagram of the read operation for the FCRAM 18 in the fourth embodiment is the same as that shown in FIG. 3 in the first embodiment in the case of the access request from the first mater 81, and the same as that shown in FIG. 4 in the first embodiment in the case of the access request from the second mater 89.

According to the fourth embodiment as explained above, in accordance with the access request signal REQ1 or REQ2 received by the request receiver 83, that is, the master 81 or 89 which outputted the access request signal, whether the command with auto precharge or the ordinary command is outputted is determined, and then the determined command is outputted to the FCRAM 18.

Thereby, when the master, which accesses random addresses in many cases, accesses the FCRAM 18, the command with auto precharge is outputted, whereby the FCRAM 18 is allowed to perform the precharge operation automatically without the precharge command PRE being outputted. When the master, which accesses sequential addresses in many cases, accesses the FCRAM 18, the ordinary command is outputted, whereby the read operation or the write operation is allowed to be performed continuously without the active command ACTV being outputted at each access. For example, in the case of the access request from the master which, like the DMAC or the like, accesses sequential addresses in many cases, the ordinary command can be outputted to the FCRAM 18. Therefore, by appropriately controlling the command to be outputted to the FCRAM 18 according to the way of access of the master to the FCRAM 18, the number of outputs of the command to the FCRAM 18 can be reduced, leading to an increase in data transfer efficiency.

Figure 9:
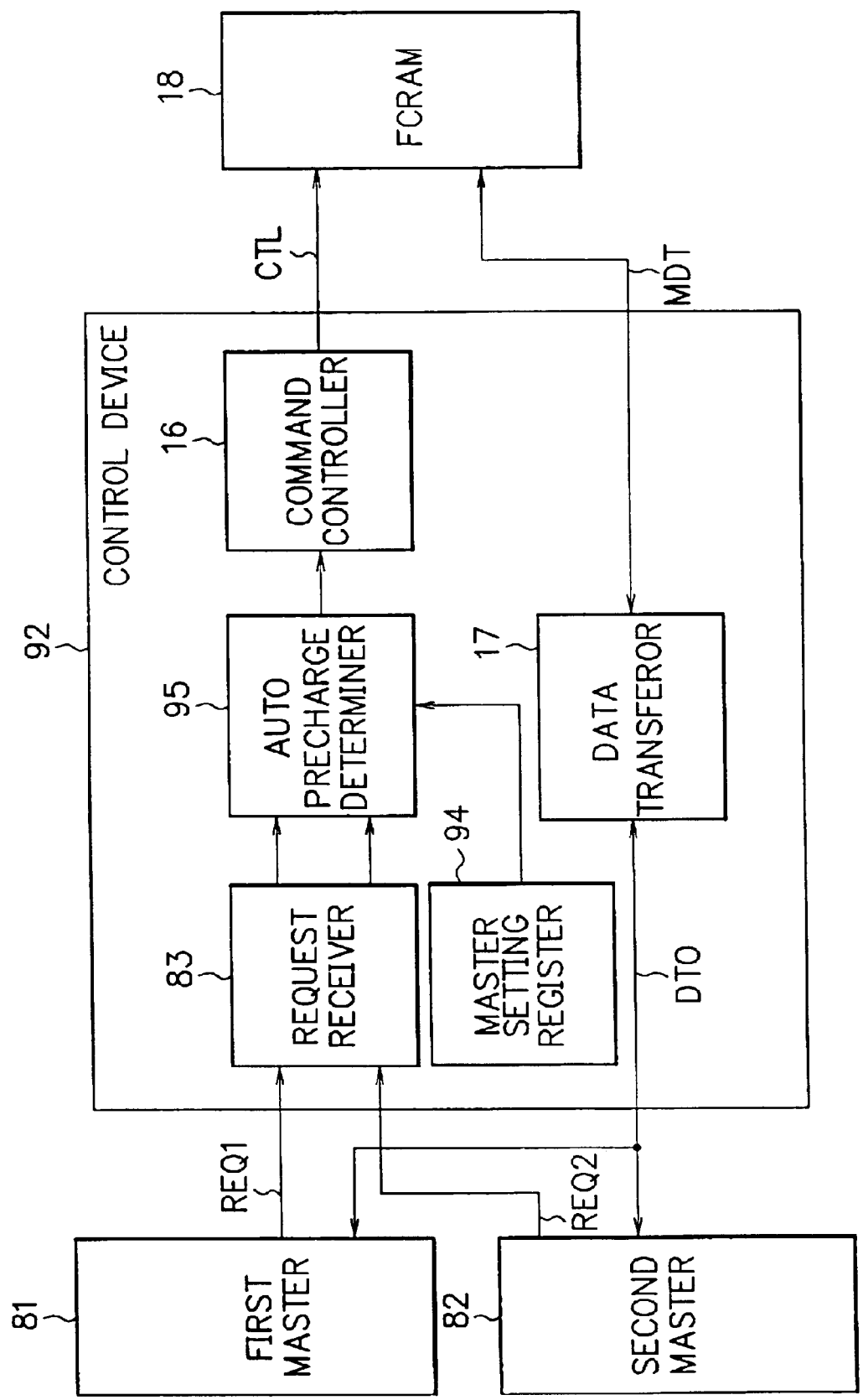
FIG. 9 is a block diagram showing another example of the configuration of the memory control device to which the control device for the semiconductor memory device according to the fourth embodiment is applied.

Incidentally, in the fourth embodiment, in the auto precharge determiner 85, whether the command with auto precharge is used or not is previously determined for each of the first and second masters 81 and 89, but as shown in FIG. 9, it may be set by providing a master setting register 94 capable of changing whether the command with auto precharge is used or not in each of the first and second masters 81 and 89 from the outside. In such a case, when instructing the command controller 16 to output the ordinary command or the command with auto precharge depending on the supplied master information, it is recommended that an auto precharge determiner 95 determine whether the ordinary command or the command with auto precharge is outputted with reference to the master setting register 94, and then instruct the control controller 16 to output the determined command. Furthermore, the provision of the master set register 94 can enhance general versatility that regardless of the date of manufacture, at any given time, whether the command with auto precharge is used or not can be changed and set in each master.

Fifth Embodiment

Next, the fifth embodiment will be explained.

Figure 10:
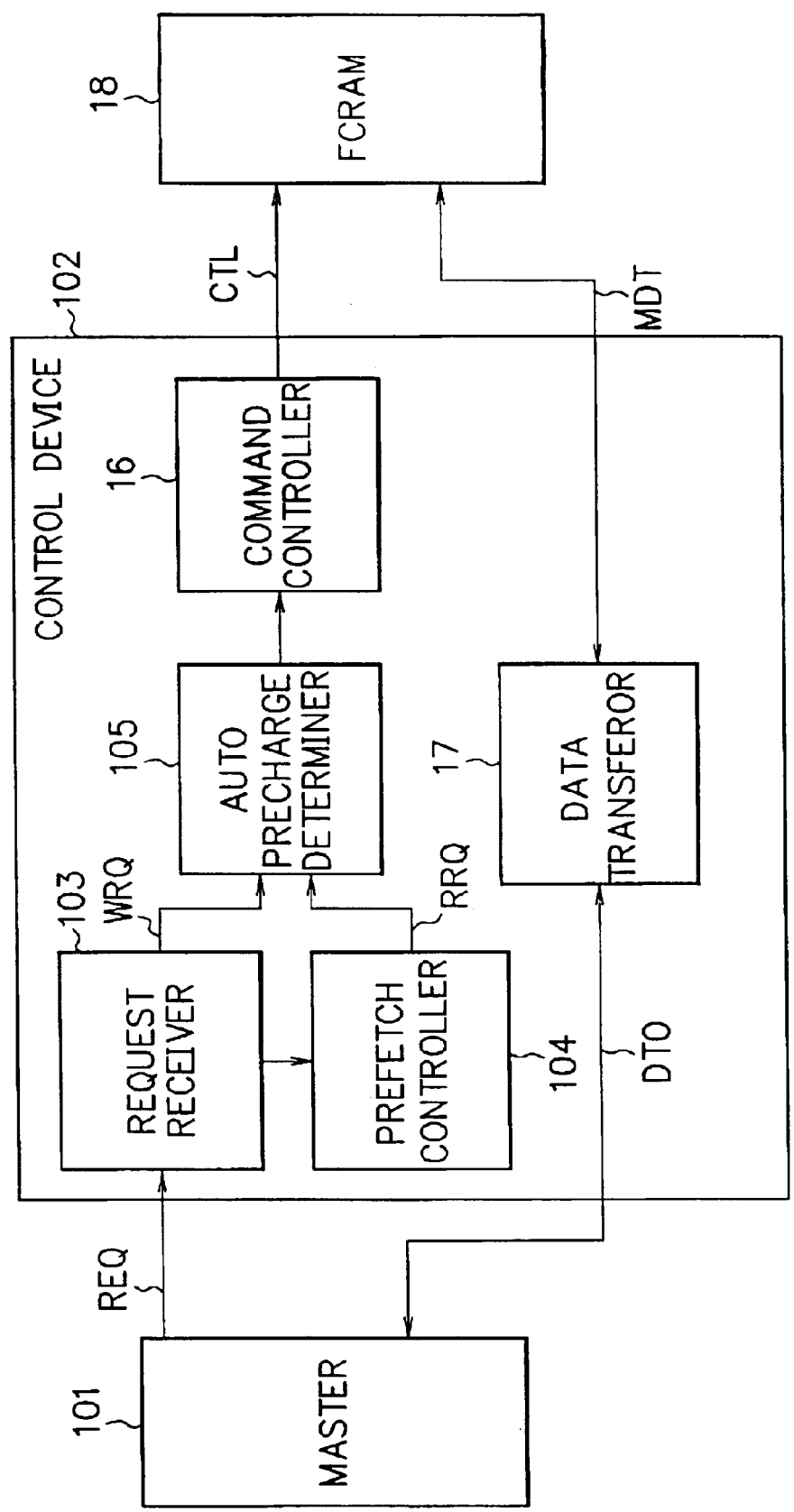
FIG. 10 is a block diagram showing an example of the configuration of a memory control device to which a control device for a semiconductor memory device according to a fifth embodiment is applied.

FIG. 10 is a block diagram showing an example of the configuration of a memory control device to which a control device for a semiconductor memory device according to the fifth embodiment of the present invention is applied. It should be mentioned that in FIG. 10, the same numerals and symbols are given to blocks having the same functions as blocks shown in FIG. 1, and a repeated explanation is omitted.

In FIG. 10, similarly to the master 11 shown in FIG. 1, a master 101 supplies the access request signal REQ to a control device 102, and sends and receives the input/output data DTO to/from the control device 102.

The control device 102 is composed of a request receiver 103, a prefetch controller 104, an auto precharge determiner 105, the command controller 16, and the data transferor 17.

The request receiver 103 receives an access request from the master 101 by means of the access request signal REQ, and based on the access class information of the access request signal REQ, when the access request is write access, it outputs the address information and a write access request signal WRQ to the auto precharge determiner 105. When the access request is read access, the request receiver 103 gives the prefetch controller 104 notice to this effect, and supplies the address information to the prefetch controller 104.

The prefetch controller 104 counts up the address (a column address portion in the address) shown by the address information supplied from the request receiver 103 to generate an address to prefetch data in predetermined sequential addresses subsequent to the address in the FCRAM 18 shown by the address information. Then, the prefetch controller 104 outputs a read access request signal PRQ with the address shown by the supplied address information and the generated address to the auto precharge determiner 105. Moreover, if the address becomes an address of another page, that is, a carry is generated in the address count-up of the column address portion in the address when the prefetch controller 104 is generating the address to prefetch data, the prefetch controller 104 gives the auto precharge determiner 105 to this effect.

The auto precharge determiner 105 determines whether the command with auto precharge is used or not based on the write access request signal WRQ supplied from the request receiver 103 and the read access request signal RRQ supplied from the prefetch controller 104.

Next, operations will be explained.

When receiving the access request from the master 101 by means of the access request signal REQ, the request receiver 103 determines whether the access request is write access or read access based on the access class information of the supplied access request signal REQ.

When the access request from the master 101 is write access as the result of the above determination, the request receiver 103 supplies the write request signal WRQ with the address information to the auto precharge determiner 105. The auto precharge determiner 105 instructs the command controller 16 to output the command with auto precharge when the write request signal WRQ is supplied thereto from the request receiver 103.

When the access request from the master 101 is read access as the result of the above determination by the request receiver 103, the request receiver 103 gives the prefetch controller 104 notice to this effect, and supplies the address information to the prefetch controller 104. The prefetch controller 104, which receives notice to the effect that the access request is read access, counts up the address (a portion corresponding to the column address in the address) shown by the supplied address information to generate an address to prefetch the data. Furthermore, the prefetch controller 104 supplies the address information, the generated address to prefetch data, and the read request signal RRQ to the auto precharge determiner 105. Incidentally, if a carry is generated when the prefetch controller 104 counts up the address, the prefetch controller 104 gives the auto precharge determiner 105 notice to this effect.

When being supplied with the read request signal RRQ and not being given notice to the effect that a carry is generated by the prefetch controller 104, the auto precharge determiner 105 instructs the command controller 16 to output the ordinary command. Moreover, when being supplied with the read request signal RRQ but given notice to the effect that a carry is generated by the prefetch controller 104, the auto precharge determiner 105 instructs the command controller 16 to output the command with auto precharge.

Operations after this by the command controller 16 and the like are the same as those in the first embodiment, and hence they are omitted.

By the operations described above, in the fifth embodiment shown in FIG. 10, as long as the read access is requested from the master 101 and no carry is generated in the address to prefetch data, the ordinary read command READ is outputted to the FCRAM 18 from the command controller 16, and if not so, the command with auto precharge READA or WRITA is outputted to the FCRAM 18.

Incidentally, as for a timing diagram of the read operation for the FCRAM 18 in the fifth embodiment, similarly to FIG. 7 shown in the third embodiment, the ordinary read command READ is outputted continuously to the FCRAM 18, and when a carry is generated in the address to prefetch data at this time, as shown at the time $T_{45}$, the read command READA with auto precharge is outputted to the FCRAM 18.

As explained above, according to the fifth embodiment, when the read access is requested from the master 101, data in the predetermined sequential addresses subsequent to the address specified by the request are prefetched. Then, when the read access is requested by the access request from the master 101, the ordinary command is outputted to the FCRAM 18, and when the write access is requested by the access request, the command with auto precharge is outputted to the FCRAM 18.

Thus, when the read access is requested by the access request, the ordinary command is outputted and the data is prefetched, whereby in the case of access to sequential addresses, the time required for the read operation can be shortened, leading to an increase in data transfer efficiency.

Incidentally, although timing diagrams of the read operation are shown in FIG. 3, FIG. 4, and FIG. 7 in the first to fifth embodiments, as concerns the write operation, data with the write command WRIT or WRITA has only to be supplied to the FCRAM 18, and timing diagrams of basic operations regarding command output when the ordinary write command WRIT and the write command WRITA with auto precharge are the same.

The present embodiments are to be considered in all respects as illustrative and no restrictive, and all changes which come within the meaning and range of equivalency of the claims are therefore intended to be embraced therein. The invention may be embodied in other specific forms without departing from the sprit or essential characteristics thereof.

As explained above, based on a received request for access to a semiconductor memory device, whether or not an access instruction for enabling an auto precharge function of automatically performing a precharge operation is supplied to the semiconductor memory device is determined, and in accordance with the result of the determination, the access instruction for enabling the auto precharge function or an access instruction for disabling the auto precharge function is supplied to the semiconductor memory device.

Thus, it becomes possible to determine whether or not the request for access to the semiconductor memory device is appropriate for the supply of the access instruction for enabling the auto precharge function and then appropriately supply a command which is the access instruction to the semiconductor memory device, whereby data transfer efficiency can be increased.

What is claimed is:

1. A control device for a semiconductor memory device having an auto precharge function of automatically performing a precharge operation in accordance with an access instruction, comprising:
    a request receiving circuit for receiving a request for access to the semiconductor memory device;
    a determining circuit for determining whether or not the access instruction for enabling the auto precharge function is supplied to the semiconductor memory device based on the access request received by the request receiving circuit;
    an instruction outputting circuit supplying the access instruction for enabling the auto precharge function or the access instruction for disabling the auto precharge function to the semiconductor memory device in accordance with a result of the determination by the determining circuit; and
    an area setting circuit in which address information showing an area in the semiconductor memory is set, wherein:
    the access request includes access address information on an address in the semiconductor memory device to be accessed, and
    the determining circuit determines whether or not the access instruction for enabling the auto precharge function is supplied to the semiconductor memory device by comparing the address information set in the area setting circuit and the access address information of the access request received by the request receiving circuit.

2. The control device for the semiconductor memory device according to claim 1, wherein;
    in the area setting circuit, address information, showing an area in the semiconductor memory device to be accessed by the access instruction for enabling the auto precharge function, is set; and
    determining circuit determines that the access instruction for enabling the auto precharge function is supplied to the semiconductor memory device when the access address information of the access request received by the request receiving circuit is included in the address information set in the area setting circuit.

3. The control device for the semiconductor memory device according to claim 1, wherein:
    in the area setting circuit, address information, showing an area in the semiconductor memory device to be accessed by the access instruction for disabling the auto precharge function is set; and
    the determining circuit determines that the access instruction for enabling the auto precharge function is supplied to the semiconductor memory device when the access address information of the access request received by the request receiving circuit and the address information set in the area setting circuit are different.

4. The control device for the semiconductor memory device according to claim 1, wherein:
    the area setting circuit is a register in which a setting is changeable from the outside.

5. A control device for a semiconductor memory device having an auto precharge function of automatically performing a precharge operation in accordance with an access instruction, comprising:
    a request receiving circuit receiving a request access to the semiconductor memory device;
    a determining circuit determining whether or not the access instruction for enabling the auto precharge function is supplied to the semiconductor memory device based on the access request received by the request circuit; and
    an instruction outputting circuit supplying the access instruction for enabling the auto precharge function or the access instruction for disabling the auto precharge function to the semiconductor memory device in accordance with a result of the determination by the determining circuit, wherein:
    the request receiving circuit receives a signal indicating an access type with the access request, and
    the determining circuit determines whether or not the access instruction for enabling the auto precharge function is supplied to the semiconductor memory device according to the signal indicating the access type received by the request receiving circuit.

6. The control device for the semiconductor memory according to claim 5, wherein:
    the signal indicating the access type is a signal indicating sequential access in which sequential areas, in the semiconductor memory device are accessed, or random access, in which random areas in the semiconductor memory device are accessed; and
    the determining circuit determines that the access instruction for enabling the auto precharge function is supplied to the semiconductor memory device when random access is indicated by the signal indicating the access type which is received by the request receiving circuit.

7. A control device for a semiconductor memory device having an auto precharge function of automatically performing a precharge operation in accordance with an access instruction, comprising:
    a request receiving circuit receiving a request access to the semiconductor memory device, the access request including data size information showing a quantity of data to be transferred;
    a determining circuit determining whether or not the access instruction for enabling the auto precharge function is supplied to the semiconductor memory device based on the access request received by the request receiving circuit;
    an instruction outputting circuit supplying the access instruction for enabling the auto precharge function or the access instruction for disabling the auto precharge function to the semiconductor memory device in accordance with a result of the determination by the determining circuit;
    a transfer number computing circuit computing a number of times of access to the semiconductor memory device based on the data size information of the access request received by the request receiving circuit; and the determining circuit determining whether or not the access instruction, enabling the auto precharge function, is supplied to the semiconductor memory device based on the number of times of access computed by the transfer number computing circuit.

8. The control device for the semiconductor memory device according to claim 7, wherein:

the transfer number computing circuit includes a counter circuit counting the number of times of access to the semiconductor memory device; and the determining circuit determines whether or not the access instruction, enabling the auto precharge function, is supplied to the semiconductor memory device according to a value counted by the counter circuit.

9. The control device for the semiconductor memory device according to claim 8, wherein:

each time an access instruction is outputted from the instruction outputting circuit to the semiconductor memory device, the counter circuit decrements a count value by one with the number of times of access to the semiconductor memory device computed based on the data size information of the access request received by the request receiving circuit as an initial value; and the determining circuit determines that the access instruction for enabling the auto precharge function is supplied to the semiconductor memory device when the value counted by the counter circuit is one.

10. A control device for a semiconductor memory device having an auto precharge function of automatically performing a precharge operation in accordance with an access instruction, comprising:

a request receiving a circuit receiving a request access to the semiconductor memory device outputted respectively from a plurality of master circuits a determining circuit determining whether or not the access instruction, enabling the auto precharge function is supplied to the semiconductor memory device based on the access request received by the request receiving circuit;

an instruction outputting circuit supplying the access instruction for enabling the auto precharge function or the access instruction for disabling the auto precharge function to the semiconductor memory device in accordance with a result of the determination by the determining circuit; and the determining circuit determines whether or not the access instruction, enabling the auto precharge function, is supplied to the semiconductor memory device depending on the master circuits which outputted the access requests received by the request receiving circuit.

11. The control device for the semiconductor memory device according to claim 10, further comprising:

a master setting circuit in which a master circuit, supplying the access instruction enabling the auto precharge function in response to the access request received by the request receiving circuit, is set.

12. The control device for the semiconductor memory device according to claim 11, wherein:

the master setting circuit is a register in which a setting is changeable from the outside.

13. The control device for the semiconductor memory device according to claim 11, wherein:

the master setting circuit is allowed to set whether or not the access instruction, enabling the auto precharge function, is supplied to the semiconductor memory device in response to the respective access requests from the plurality of master circuits received by the request receiving circuit.

14. A control device for a semiconductor memory device having an auto precharge function of automatically performing a precharge operation in accordance with an access instruction, comprising:

a request receiving circuit receiving a request access to the semiconductor memory device;

a determining circuit determining whether or not the access instruction, enabling the auto precharge function, is supplied to the semiconductor memory device based on the access request received by the request receiving circuit;

an instruction outputting circuit supplying the access instruction, enabling the auto precharge function, or the access instruction, disabling the auto precharge function to the semiconductor memory device, in accordance with a result of the determination by the determining circuit;

a prefetch controlling circuit reading data in an area specified by the access request and, in addition, data in sequential areas subsequent to the specified area when the access request received by the request receiving circuit is a read access request; and the determining circuit determining that the access instruction, disabling the auto precharge function, is supplied to the semiconductor memory circuit when the access request received by the request receiving circuits the read access request.

15. A method of controlling a semiconductor memory device having an auto precharge function of automatically performing a precharge operation in accordance with an access instruction, comprising:

receiving a request for access to the semiconductor memory device;

determining whether or not the access instruction, enabling the auto precharge function is supplied to the semiconductor memory device, based on the received access request;

supplying the access instruction enabling the auto precharge function or the access instruction disabling the auto precharge function to the semiconductor memory device, in accordance with a result of the determination, wherein:

the access request includes access address information on an address in the semiconductor memory device to be accessed; and the determining, of whether or not the access instruction enabling the auto precharge function is supplied to the semiconductor memory device, is performed by comparing the address information showing an area set in the semiconductor memory device and the received access address information of the access request.

16. The method of controlling the semiconductor memory device according to claim 15, wherein:

the address information is address information showing an area in the semiconductor memory device to be accessed by the access instruction enabling the auto precharge function; and the determining, of whether or not the access instruction, enabling the auto precharge function, determines that the access instruction, enabling the auto precharge function is supplied to the semiconductor memory device when the set address information matches the received access address information of the access request.

17. A method of controlling the semiconductor memory device having an auto precharge function of automatically performing a precharge operation in accordance with an access instruction, comprising:

receiving a request for access to the semiconductor memory device;

determining whether or not the access instruction, enabling the auto precharge function, is supplied to the semiconductor memory device, based on the received access request;

supplying the access instruction enabling the auto precharge function or the access instruction disabling the auto precharge function to the semiconductor memory device, in accordance with a result of the determination; and receiving a signal indicating an access request, wherein the determining, of whether or not the access instruction for enabling the auto precharge function is supplied to the semiconductor memory circuit, and of whether or not the access instruction for enabling the auto precharge function is supplied to the semiconductor memory device, is determined in accordance with the received signal indicating the access type.

18. The method of controlling the semiconductor memory device according to claim 17, wherein:

the signal indicating the access type is a signal indicating sequential access, in which sequential areas in the semiconductor memory device are accessed, or random access, in which random areas in the semiconductor memory device are accessed; and the determining, of whether or not the access instruction, enabling the auto precharge function, is supplied to the semiconductor memory device determines that the access instruction, enabling the auto precharge function, is supplied to the semiconductor memory device when random access is indicated by the received signal indicating the access type.

19. A method of controlling the semiconductor memory device having an auto precharge function of automatically performing a precharge operation in accordance with an access instruction, comprising:

receiving a request for access to the semiconductor memory device;

determining whether or not the access instruction, enabling the auto precharge function, is supplied to the semiconductor memory device, based on the received access request;

supplying the access instruction enabling the auto precharge function or the access instruction disabling the auto precharge function to the semiconductor memory device, in accordance with a result of the determination, wherein:

a prefetch function, to read data in an area specified by the access request and, in addition, data in sequential areas subsequent to the specified area, is provided when the received access request is a read access request, and the determining of whether or not the access instruction, enabling the auto precharge function, is supplied to the semiconductor memory device, further determines that the access instruction, disabling the auto precharge, is supplied to the semiconductor memory device when the received access request is the read access request.

20. A method of controlling a semiconductor memory device having an auto precharge function of automatically performing a precharge operation in accordance with an access instruction, comprising:

receiving a request for access to the semiconductor memory device having data size information showing a quantity of data to be transferred;

computing a number of times of access to the semiconductor memory device based on the data information of the received access request;

determining whether or not the access instruction enabling the auto precharge function is supplied to the semiconductor memory device, based on the computed number of times of access; and supplying the access instruction enabling the auto precharge function or the access instruction disabling the auto precharge function to the semiconductor memory device in accordance with a result of the determination.

21. A method of controlling a semiconductor memory device having an auto precharge function of automatically performing a precharge operation in accordance with an access instruction, comprising:

receiving a request for access to the semiconductor memory device outputted from any one of a plurality of master circuits;

determining whether or not the access instruction, enabling the auto precharge function, is supplied to the semiconductor memory device in accordance with the master circuit which outputs the received access request; and supplying the access instruction enabling the auto precharge function or the access instruction disabling the auto precharge function to the semiconductor memory device, in accordance with a result of the determination.

* * * * *

UNITED STATES PATENT AND TRADEMARK OFFICE
CERTIFICATE OF CORRECTION

PATENT NO. : 6,886,072 B2
DATED : April 26, 2005
INVENTOR(S) : Toshiaki Saruwatari It is certified that error appears in the above-identified patent and that said Letters Patent is hereby corrected as shown below:

Column 15,
Line 22, delete both occurrences of "for".
Line 24, delete "for".
Line 54, before "determining" insert -- the --.
Line 65, after "function" insert -- , --.

Column 16,
Line 19, after "the request" (second occurrence) insert -- receiving --.

Column 17,
Line 35, after "receiving" delete "a".

Column 18,
Line 32, change "circuits" to -- circuit is --.
Line 41, after "function" insert -- , --.

Column 19,
Line 2, after "function" insert -- , --.
Lines 6 and 43, change "the" to -- a --.

Column 20,
Line 24, after "data" insert -- size --.

Signed and Sealed this

Fourteenth Day of February, 2006

JON W. DUDAS
*Director of the United States Patent and Trademark Office*